US010797659B2

(12) United States Patent
Caduff

(10) Patent No.: US 10,797,659 B2
(45) Date of Patent: Oct. 6, 2020

(54) AUDIO AMPLIFIER HAVING MULTIPLE SIGMA-DELTA MODULATORS TO DRIVE AN OUTPUT LOAD

(71) Applicant: SEMICONDUCTOR COMPONENTS INDUSTRIES, LLC, Phoenix, AZ (US)

(72) Inventor: Christian Venanzi Caduff, Niederscherli (CH)

(73) Assignee: SEMICONDUCTOR COMPONENTS INDUSTRIED, LLC, Phoenix, AZ (US)

(*) Notice: Subject to any disclaimer, the term of this patent is extended or adjusted under 35 U.S.C. 154(b) by 0 days.

(21) Appl. No.: 16/159,769

(22) Filed: Oct. 15, 2018

(65) Prior Publication Data

US 2020/0119704 A1     Apr. 16, 2020

(51) Int. Cl.
| | |
|---|---|
| H03F 3/38 | (2006.01) |
| H03F 3/217 | (2006.01) |
| H03M 3/00 | (2006.01) |
| H03F 3/393 | (2006.01) |
| H03F 3/185 | (2006.01) |

(52) U.S. Cl.
CPC .......... *H03F 3/2171* (2013.01); *H03F 3/185* (2013.01); *H03F 3/2173* (2013.01); *H03F 3/393* (2013.01); *H03M 3/43* (2013.01); *H03M 3/456* (2013.01)

(58) Field of Classification Search
CPC ........................................................ H03F 3/38
USPC ................................................... 330/10, 251
See application file for complete search history.

(56) References Cited

U.S. PATENT DOCUMENTS

| | | | | |
|---|---|---|---|---|
| 6,724,249 B1* | 4/2004 | Nilsson | ................. | H03F 3/2173 330/10 |
| 6,970,503 B1 | 11/2005 | Kalb | | |
| 7,194,036 B1* | 3/2007 | Melanson | ............. | H03M 7/304 341/143 |
| 7,924,193 B2* | 4/2011 | Lin | ......................... | H03L 7/085 341/143 |
| 8,306,106 B2 | 11/2012 | Alexander et al. | | |
| 9,350,226 B2* | 5/2016 | Nam | .................... | H02M 7/5387 |
| 2003/0097239 A1* | 5/2003 | Petrofsky | ............... | G01R 19/02 702/198 |
| 2005/0030093 A1* | 2/2005 | Olson | .................... | H03F 3/2173 330/10 |
| 2005/0054307 A1* | 3/2005 | Watts | ...................... | H03F 3/217 455/127.3 |
| 2008/0042746 A1 | 2/2008 | Kozak et al. | | |

(Continued)

OTHER PUBLICATIONS

Hui Feng et al., "The Correction Method of Power Noise in Digital Class D Power Amplifiers," Journal of Software, vol. 8, No. 2, Feb. 2013.

*Primary Examiner* — Henry Choe
(74) *Attorney, Agent, or Firm* — Brake Hughes Bellerman LLP

(57) ABSTRACT

According to an aspect, an audio amplifier includes a first sigma-delta modulator configured to receive a digital audio signal and generate a first multi-level output signal based on the audio signal, and a second sigma-delta modulator configured to receive the first multi-level output signal from the first sigma-delta modulator and generate a second multi-level output signal. The second multi-level output signal has a number of levels less than a number of levels of the first multi-level output signal.

18 Claims, 5 Drawing Sheets

(56) References Cited

U.S. PATENT DOCUMENTS

2015/0145571 A1\* 5/2015 Perrott .................... H03L 7/093
327/159

\* cited by examiner

US 10,797,659 B2

AUDIO AMPLIFIER HAVING MULTIPLE SIGMA-DELTA MODULATORS TO DRIVE AN OUTPUT LOAD

TECHNICAL FIELD

This description relates to an audio amplifier having multiple sigma-delta modulators to drive an output load.

BACKGROUND

To achieve improved efficiency, some power amplifiers use switching power output stages (e.g., class-D amplifiers). In some examples, a class-D amplifier may use pulse width modulation (PWM) or pulse density modulation (PDM) to convert the incoming input signal, via a sigma delta modulator, into one or more high frequency pulses.

SUMMARY

According to an aspect, an audio amplifier includes a first sigma-delta modulator configured to receive a digital audio signal and generate a first multi-level output signal based on the audio signal, and a second sigma-delta modulator configured to receive the first multi-level output signal from the first sigma-delta modulator and generate a second multi-level output signal. The second multi-level output signal has a number of levels less than a number of levels of the first multi-level output signal.

According to some aspects, the audio amplifier may include one or more of the following features (or any combination thereof). The number of levels of the first multi-level output is at least three times more than the number of levels of the second multi-level output. The number of levels of the second multi-level output signal is two or three, and the number of levels of the first multi-level output is greater than four. The first sigma-delta modulator is configured to generate the first multi-level output according to a first clock signal, and the second sigma-delta modulator is configured to generate the second multi-level output according to a second clock signal. The second clock signal defines a sampling frequency of the second sigma-delta modulator that is greater than a sampling frequency of the first sigma-delta modulator. The sampling frequency of the second sigma-delta modulator is at least four times greater than the sampling frequency of the first sigma-delta modulator. The audio amplifier may include an H-bridge circuit configured to be driven by the second multi-level output signal. The H-bridge circuit is configured to be coupled to one or more speakers. The first sigma-delta modulator is an N-order sigma-delta modulator, and N is greater or equal to two. The second sigma-delta modulator has an order less than an order of the first sigma-delta modulator. The audio amplifier is a class-D amplifier.

According to an aspect, a class-D audio amplifier includes a first sigma-delta modulator configured to receive a digital audio signal and generate a first multi-level output signal based on the audio signal, a second sigma-delta modulator configured to receive the first multi-level output signal from the first sigma-delta modulator and generate a second multi-level output signal, where the second multi-level output signal has a number of levels less than a number of levels of the first multi-level output signal, and an H-bridge circuit configured to receive the second multi-level output signal. The H-bridge circuit is configured to be coupled to one or more speakers.

According to some aspects, the class-D audio amplifier may include one or more of the above/below features (or any combination thereof). The first sigma-delta modulator is configured to generate the first multi-level output according to a sampling frequency that is less than a sampling frequency of the second sigma-delta modulator. The first sigma-delta modulator is an N-order sigma-delta modulator, and N is greater or equal to two. The second sigma-delta modulator has an order less than an order of the first sigma-delta modulator. The number of levels of the first multi-level output signal is two or three, and the number of levels of the first multi-level output is in a range of four to three hundred.

According to an aspect, a method for modulating an audio signal to drive one or more speakers includes receiving, by a first sigma-delta modulator, a digital audio signal, generating, by the first sigma-delta modulator, a first multi-level output signal based on the digital audio signal, and generating, by a second sigma-delta modulator, a second multi-level output signal from the first multi-level output signal, where the second multi-level output signal has a number of levels less than a number of levels of the first multi-level output signal, and the second multi-level output signal is configured to be used to drive at least one speaker.

According to some aspects, the method may include one or more of the above/below features (or any combination thereof). The first multi-level output signal is generated according to a sampling frequency that is less than a sampling frequency of the second sigma-delta modulator. The number of levels of the second multi-level output signal is two or three, and the number of levels of the first multi-level output is greater than four. The first sigma-delta modulator is an N-order sigma-delta modulator, and N is greater or equal to two, and the second sigma-delta modulator has an order less than an order of the first sigma-delta modulator.

The details of one or more implementations are set forth in the accompanying drawings and the description below. Other features will be apparent from the description and drawings, and from the claims.

DETAILED DESCRIPTION

Figure 1:
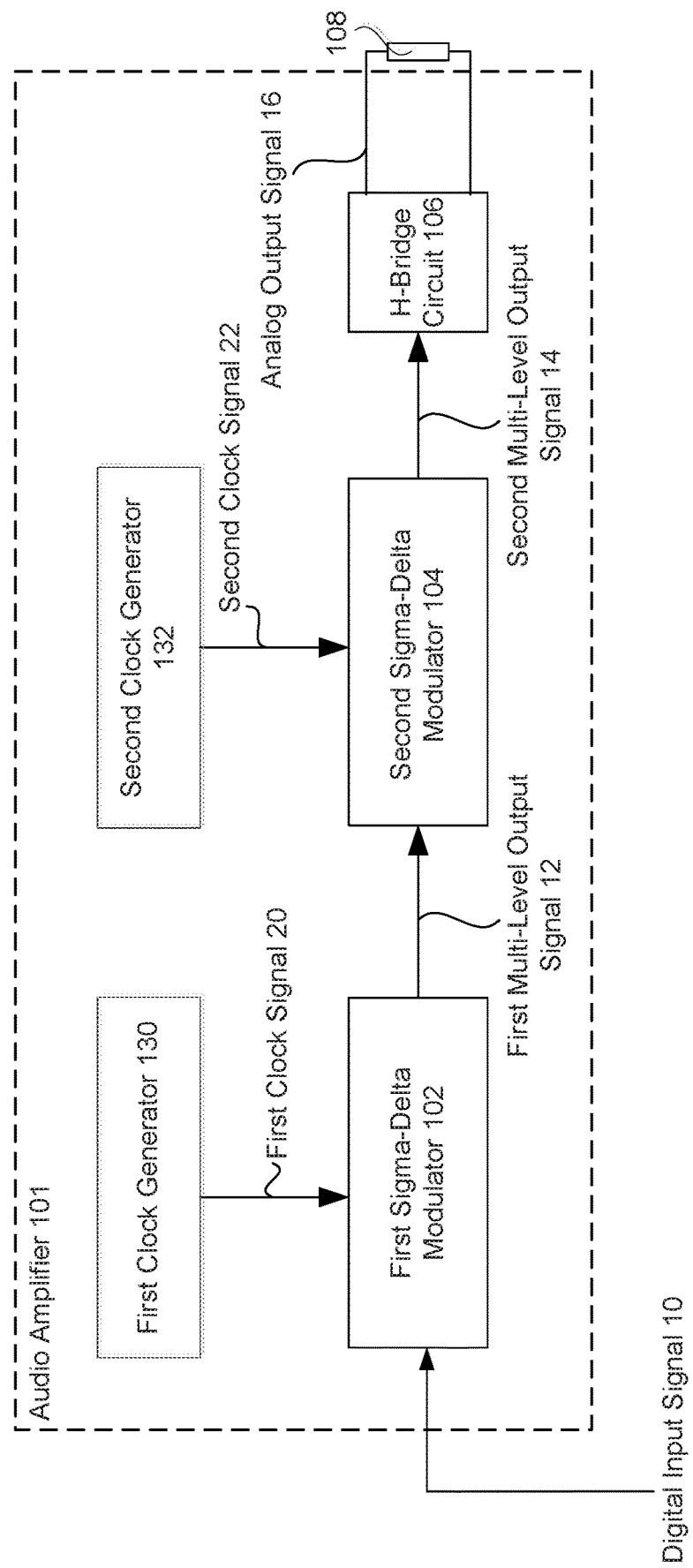
FIG. 1 illustrates an audio amplifier having multiple sigma-delta modulators to drive an output load according to an aspect.

An audio amplifier as described herein can have multiple sigma-delta modulators that drive an output load (e.g., speakers). In some examples, the audio amplifier is a class-D digital-to-analog converter (DAC). The audio amplifier includes a first sigma-delta modulator configured to receive a digital input signal, and a second sigma-delta modulator coupled to the output of the first sigma-delta modulator. In some examples, the output of the second sigma-delta modulator drives an H-bridge circuit that is configured to be coupled to a load such as one or more speakers. In some examples, the audio amplifier does not use (e.g., excludes) pulse width modulation or pulse density modulation to drive the output load.

In some examples, the first sigma-delta modulator is a multi-level, high-order sigma-delta modulator. In some examples, the first sigma-delta modulator generates a digital output having multiple levels (e.g., greater than 3 levels). In some examples, the first sigma-delta modulator has an order greater or equal to 2. In some examples, the second sigma-delta modulator generates a digital output having 2 or 3 levels. In some examples, the second sigma-delta modulator is a first-order sigma-delta modulator. The second sigma-delta modulator has a sampling frequency greater than a sampling frequency of the first sigma-delta modulator.

At least one advantage is that the first sigma-delta modulator (e.g., the high-order modulator) has less saturation problems and the output has less power consumption and/or good linearity (e.g., perfect linearity) due to the second sigma-delta modulator (e.g., the 2 or 3 output level modulator). For example, conventional class-D modulators may include pulse density modulation that use a single sigma-delta modulator which generates two or three output levels on an H-bridge circuit. A two-level output modulator has the advantage of perfect linearity (e.g., substantially perfect linearity, near perfect linearity). However, in some examples, the feedback inside the modulator may have a large (e.g., very large) amplitude and, therefore, the modulator may be prone to saturation (e.g., especially for higher order modulators). Additionally, a maximum voltage may be applied to the load, which may lead to high power consumption. A three-level output modulator has lower power consumption, but may still be prone to saturation. The high power consumption of the load can generate a voltage drop on the power supply, which may result in a distorted output signal. A multi-level output modulator (e.g., greater than 3 levels) may have less problems with saturation and/or power consumption, but the multi-level output modulator does not have perfect or near perfect linearity. However, the audio amplifier discussed herein may decrease (or eliminate) saturation effects, provide good (or perfect) linearity, increase noise performance, and/or consume less power than conventional class-D audio amplifiers.

In some applications, the power supply for an audio amplifier is a battery, which may have a high output resistance. With high-ohmic loads (e.g., speakers having a high resistance), some conventional audio amplifiers may be sufficient to drive these loads. However, in some portable applications, low-impedance loads (e.g., low-impedance speakers) are used, and the large current drawn by the speakers pulls down the voltage of the power supply, which may produce unacceptable distortions on the audio signal. However, the audio amplifier discussed herein may drive low-impedance loads without having a negative impact on audio performance while reducing the power consumption. In some examples, the audio amplifier discussed herein provides a dynamic range of the output stage with a low-impendence load greater than, for example, 100 db while reducing the power consumer to the micro amp range (e.g., between 5 µA and 700 µA, or between 50 µA and 200 µA (e.g., 95 µA, 74 µA, or 55 µA)).

FIG. 1 illustrates an audio amplifier 101 having multiple sigma-delta modulators to drive an output load according to an aspect. The audio amplifier 101 is configured to receive a digital input signal 10 (e.g., an audio signal) and convert the digital input signal 10 to an analog output signal 16 with desirable (e.g., good) linearity (e.g., perfect linearity) with reduced saturation effects while consuming less power than conventional amplifiers. The analog output signal 16 is configured to drive a load 108 such as one or more speakers (not shown). In some examples, the audio amplifier 101 does not use (e.g., excludes) pulse width modulation or pulse density modulation to drive the load 108. For example, the audio amplifier 101 does not convert a sigma-delta output to a discrete pulse width modulated signal.

In some examples, the audio amplifier 101 is included on an integrated circuit of a device such as an electronic device and/or portable device (e.g., smartphone, speaker device, etc.). In some examples, the audio amplifier 101 is included on an application specific integrated circuit (ASIC). In some examples, the audio amplifier 101 is included on a system on chip (SOC). In some examples, the audio amplifier 101 is a class-D audio amplifier. In some examples, the audio amplifier 101 is a class-D digital-to-analog converter.

The audio amplifier 101 includes a first sigma-delta modulator 102, and a second sigma-delta modulator 104. The first sigma-delta modulator 102 is configured to receive the digital input signal 10 (e.g., the audio signal). The second sigma-delta modulator 104 is coupled to (and configured to receive) an output of the first sigma-delta modulator 102. In some examples, the audio amplifier 101 includes an H-bridge circuit 106 configured to receive the output of the second sigma-delta modulator 104. In some examples, the H-bridge circuit 106 is considered the output stage of the audio amplifier 101. The H-bridge circuit 106 is configured to be coupled to the load 108. In some examples, the load 108 includes one or more speakers. The H-bridge circuit 106 is configured to switch the polarity of a voltage applied to the load 108 to generate the analog output signal 16. In some examples, the output of the H-bridge circuit 106 has two voltage levels (e.g., −VBAT/+VBAT). In some examples, the output of the H-bridge circuit 106 has three levels (e.g., −VBAT/0V/+VBAT). The H-bridge circuit 106 may include switches, relays, and/or transistors.

The first sigma-delta modulator 102 is configured to generate a first multi-level output signal 12 based on the digital input signal 10, where the first multi-level output signal 12 has a plurality of first levels. In some examples, the first sigma-delta modulator 102 is a digital-to-digital sigma-delta modulator. In some examples, the first levels of the first multi-level output signal 12 are logical (or digital) levels. In some examples, the first levels of the first multi-level output signal 12 are logical (or digital) levels represented by bits. Generally, the number of levels equals 2^(number of bits). However, in some examples, all possible levels for a certain number of bits are not used. As an example, to maintain symmetry, the first levels for the first multi-level output signal 12 may be −8, −7, −6, −5, −4, −3, −2, −1, 0, 1, 2, 3, 4, 5, 6, 7, and 8, which result in 17 levels. To represent the 17 levels, 5 bits may be required (although 5 bits could represent 32 levels). In some examples, the number of first levels is any integer greater than 3. For example, the first levels may include at least level 1, level 2, level 3, level 4, where each of these levels corresponds to a different value. In some examples, the number of bits for the first multi-level output signal 12 is any number greater than 2 (e.g., an X-bit output signal, where X is equal to or greater than 2). In some examples, the number of first levels is in a range of 4 to 257. In some examples, the number of first levels is in a range of 10-20. In some examples, the number of first levels is 17.

The first sigma-delta modulator 102 is configured to convert the digital input signal 10 into a lower-resolution but higher sample-frequency signal (e.g., the first multi-level output signal 12) that is mapped to the plurality of first levels. The first sigma-delta modulator 102 may include one or more integrator(s), feedback loop(s), feedforward loop(s), latch(s), register(s), comparator(s), difference circuit(s), filter(s), and/or an adder circuit(s), etc. In some examples, the first output levels of the first sigma-delta modulator 102 are generated by one or several integrators and feedback and/or feed forward loop(s) and by quantizing the output of the integrator (or last integrator).

The first sigma-delta modulator 102 is operated based on a first clock signal 20 that is higher than a data rate of the digital input signal 10. In some examples, the audio amplifier 101 includes a first clock generator 130 configured to generate the first clock signal 20. The first clock signal 20 may define the sampling frequency of the first sigma-delta modulator 102. For example, the first sigma-delta modulator 102 is configured to sample the digital input signal 10 according to the sampling frequency and then quantize the sampled signal into the first multi-level output signal 12 (e.g., a digital signal having a number of bits that represent the number of first levels). In some examples, the first clock signal 20 has a frequency in a range of 0.5 to 4 MHz, which corresponds to the sampling frequency (e.g., how fast the first sigma-delta modulator 102 operates).

In some examples, the first sigma-delta modulator 102 is an N-order sigma-delta modulator, where N is greater or equal to two. For example, the number of integrators, and consequently, the number of internal feedback loops, indicates the order of a sigma-delta modulator. In some examples, the number of stages indicates the order of a sigma-delta modulator, where a single stage modulator is a first-order modulator, and a two-stage modulator is a second-order modulator, etc. In some examples, the first sigma-delta modulator 102 may include two internal feedback loops or more than two internal feedback loops (or two integrators or more than two integrators). Each stage of the first sigma-delta modulator 102 may include an integrator, a feedback loop, feedforward loop, a latch, a register, a comparator, a difference circuit, and/or an adder circuit, etc.

The second sigma-delta modulator 104 is configured to generate a second multi-level output signal 14 based on the first multi-level output signal 12, where the second multi-level output signal 14 has a plurality of second levels, and the plurality of second levels is less than the plurality of first levels of the first multi-level output signal 12. In some examples, the second sigma-delta modulator 104 is a digital-to-digital sigma-delta modulator. In some examples, the second levels of the second multi-level output signal 14 are logical (or digital) levels. In some examples, the second levels of the second multi-level output signal 14 are logical (or digital levels) represented by bits, where the number of bits for the second multi-level output signal 14 is less than the number of bits for the first multi-level output signal 12. In some examples, the number of first levels is at least four times more than the number of second levels. In some examples, the number of first levels is at least five times more than the number of second levels. In some examples, the number of second levels is 2 (e.g., +VBAT, −VBAT). In some examples, the number of second levels is 3 (e.g., +VBAT, 0, −VBAT). In some examples, the number of bits for the second multi-level output signal 14 is 1 (e.g., a 1-bit digital output signal). In some examples, the number of bits for the second multi-level output signal 14 is 2 (e.g., a 2-bit digital output signal).

The second sigma-delta modulator 104 is configured to convert the first multi-level output signal 12 into a lower-resolution but higher sample-frequency signal that is mapped to the plurality of second levels. In some examples, the audio amplifier 101 uses the second sigma-delta modulator 104 (e.g., instead of a pulse width modulator) for converting multi-level output to a three-level output (or two-level output), which may result in additional noise shaping (thereby improving the performance of the audio amplifier 101). The second sigma-delta modulator 104 may include one or more integrator(s), feedback loop(s), feedforward loop(s), latch(s), register(s), comparator(s), difference circuit(s), filter(s), and/or an adder circuit(s), etc. In some examples, the second output levels of the second sigma-delta modulator 104 are generated by one or several integrators and feedback and/or feed forward loop(s) and by quantizing the output of the integrator (or last integrator).

The second sigma-delta modulator 104 is operated based on a second clock signal 22 that is faster than the first clock signal 20. In some examples, the audio amplifier 101 includes a second clock generator 132 configured to generate the second clock signal 22. In some examples, instead of two clock generators, the audio amplifier 101 includes a single clock generator that generates the first clock signal 20 and the second clock signal 22. The second clock signal 22 defines a sampling frequency of the second sigma-delta modulator 104. The second sigma-delta modulator 104 is configured to sample the first multi-level output signal 12 according to the sampling frequency and then quantize the sampled signal into the second multi-level output signal 14 (e.g., a digital signal having a number of bits that represent the number of second levels). In some examples, the sampling frequency of the second sigma-delta modulator 104 is at least twice as fast as the sampling frequency of the first sigma-delta modulator 102. In some examples, the sampling frequency of the second sigma-delta modulator 104 is eight times as fast as the sampling frequency of the first sigma-delta modulator 102. In some examples, the second clock signal 22 has a frequency in a range of 1 to 32 MHz.

In some implementations, the second sigma-delta modulator 104 has an order less than an order of the first sigma-delta modulator 102. In some examples, the second sigma-delta modulator 104 has at least one less integrator, feedback loop, and/or stage than the first sigma-delta modulator 102. In some examples, the second sigma-delta modulator 104 is a first-order sigma-delta modulator, where the second sigma-delta modulator 104 has a single feedback loop and/or single integrator. In some examples, the second sigma-delta modulator 104 is a 3-level first-order modulator that is clocked eight times higher than the first sigma-delta modulator 102. In some examples, the output of the high-order multi-level sigma modulator (e.g., the first sigma-delta modulator 102) is converted to a three-level output by a second low-order sigma-delta modulator (e.g., the second sigma-delta modulator 104). In some implementations, the arrangement of the first sigma-delta modulator 102 with the second sigma-delta modulator 104 combines the noise-shaping of a high-order multi-level modulator with the linearity of a three-level output.

The power consumption of the audio amplifier 101 is lower (e.g., much lower) than a high-order three-level sigma-delta modulator. For example, a lower clock speed is used in the large modulator (e.g., the first sigma-delta modulator 102), where the small modulator (e.g., the second sigma-delta modulator 104) operates at a higher speed.

Also, in some implementations, the time that the battery voltage is applied to the load 108 may be decreased. In some examples, the time that the audio amplifier 101 applies the battery voltage to the load 108 is less than one percent.

Further, the noise shaping by the audio amplifier 101 is flatter. For example, noise does not rise too high that is outside of the usable frequency band, and the second sigma-delta modulator 104 distributes the noise better on the high frequencies, which reduces AC power consumed by the load 108. Also, as compared to some conventional approaches, there is no feedback (e.g., excludes a feedback loop) from one sigma-delta modulator to another sigma-delta modulator. For example, there is no feedback loop (e.g., a feedback loop is excluded) from the output of the second sigma-delta modulator 104 to the input of the first sigma-delta modulator 102.

Figure 2:
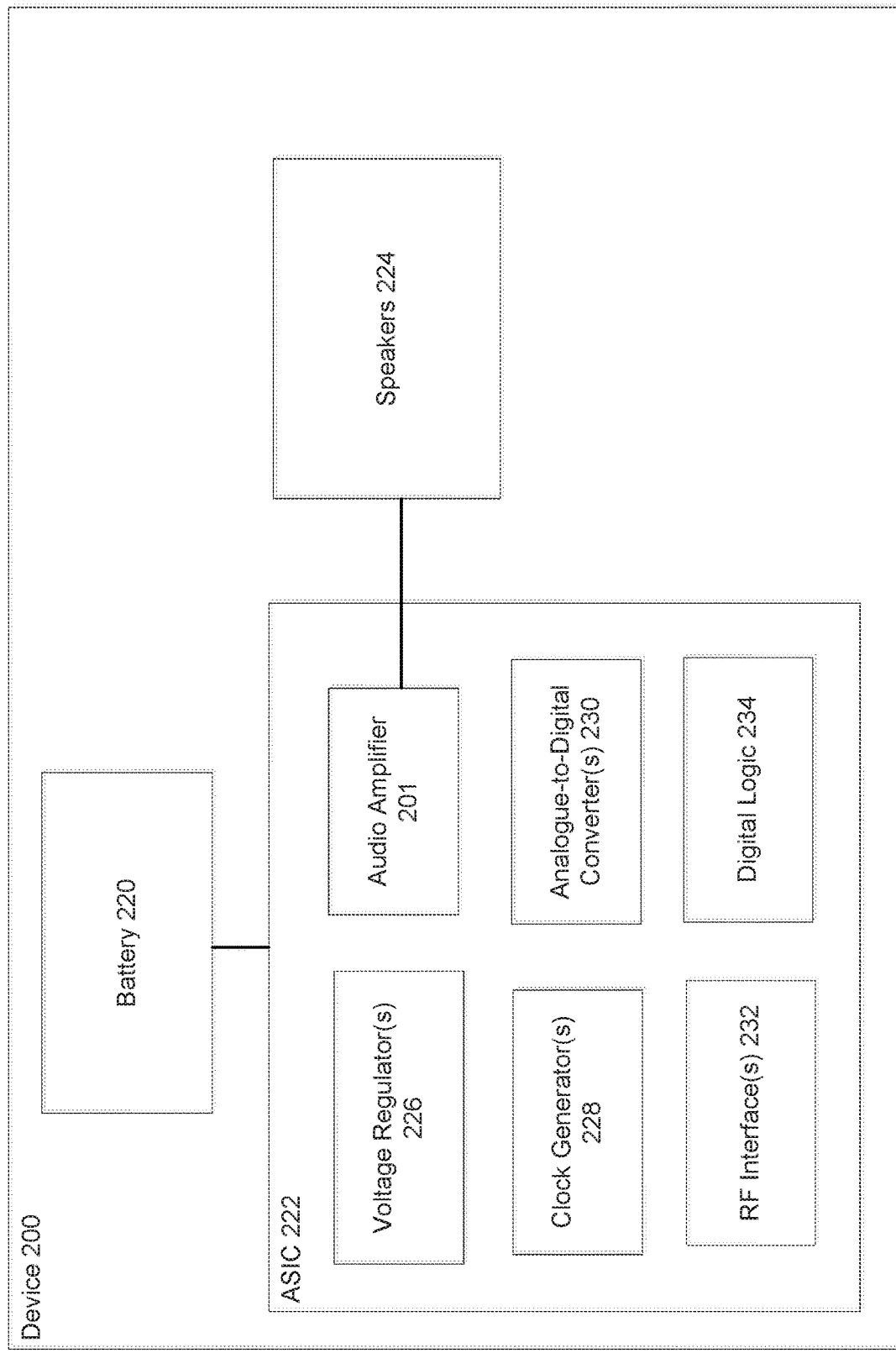
FIG. 2 illustrates a device having an audio amplifier to drive an output load according to an aspect.

FIG. 2 illustrates a device 200 having an audio amplifier 201 to drive an output load according to an aspect. The audio amplifier 201 may be the audio amplifier 101 of FIG. 1, and may include any of the features discussed with reference to FIG. 1. The device 200 may include any type of user-operated device that has a battery 220 and one or more speakers 224. In some examples, the device 200 is a portable device and/or electronic device such as a smartphone, tablet, computer, speaker device, etc. The device 200 includes an application specific integrated circuit (ASIC) 222 that includes the audio amplifier 201. In some examples, the ASIC 222 may include voltage regulator(s) 226, clock generator(s) 228, analogue-to-digital converter(s) 230, radio frequency (RF) interface(s) 232, and/or digital logic 234. The ASIC 222 may be powered by the battery 220, and the output of the audio amplifier 201 is coupled to the speakers 224. In some examples, the battery 220 may have a high output resistance (e.g., greater than 10 Ohm).

In some examples, the speakers 224 have low impedance (e.g., below 50 Ohm or below 10 Ohm). The low impedance of the speakers 224 may cause the speakers 224 to draw a relatively large amount of current, which pulls down the voltage of the battery 220. This may produce unacceptable distortions on the audio signal for some conventional audio amplifiers. However, the audio amplifier 201 may drive low-impedance loads without having a negative impact on the audio performance while reducing the power consumption.

In some examples, the audio amplifier 201 provides a dynamic range of the output stage with a low-impendence load greater than 100 db (e.g., the range of a conventional modulator may be approximately 55 db) while reducing the power consumer to the micro amp range (e.g., between 5 µA and 700 µA, or between 50 µA and 200 µA (e.g., 95 µA, 74 µA, or 55 µA)) (e.g., the power consumption of a conventional modulator may be 1.3 mA). Also, due to the reduced power consumption, the audio amplifier 201 may reduce the amount of voltage supply drops on the battery 220 when driving low impedance loads. Reducing the power supply drops may be especially advantageous if high-ohmic batteries are used for the battery 220.

Figure 3:
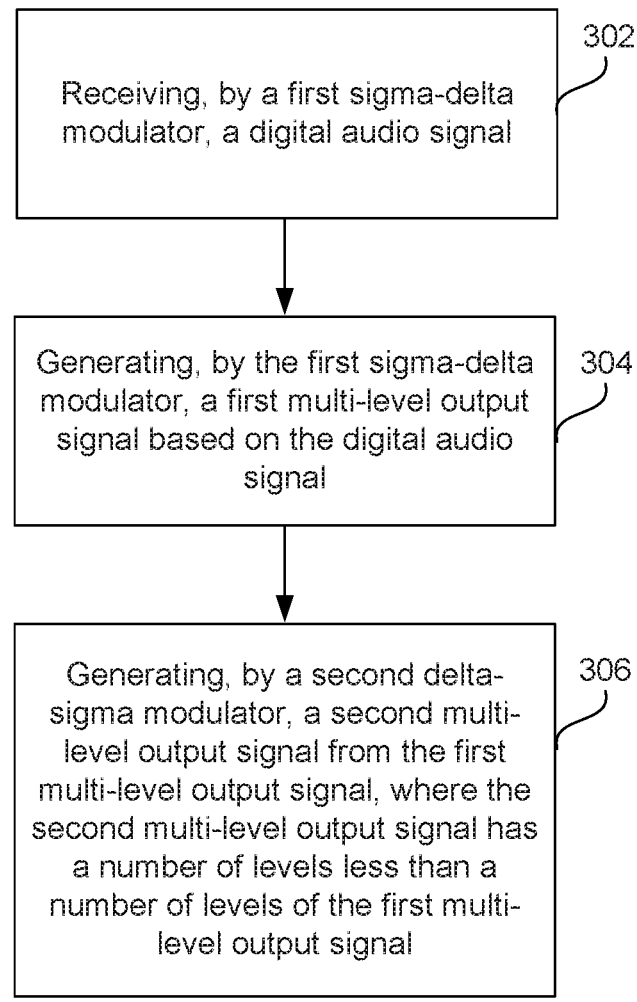
FIG. 3 illustrates a flowchart depicting example operations for modulating an audio signal to drive one or more speakers according to an aspect.

FIG. 3 illustrates a flowchart 300 depicting example operations for modulating an audio signal to drive one or more speakers according to an aspect. The example operations of the flowchart 300 may be performed by any of the audio amplifiers discussed herein. Although the flowchart 300 of FIG. 3 illustrates operations in sequential order, it will be appreciated that this is merely an example, and that additional or alternative operations may be included. Further, operations of FIG. 3 and related operations may be executed in a different order than that shown, or in a parallel or overlapping fashion.

Operation 302 includes receiving, by a first sigma-delta modulator, a digital audio signal. For example, referring to FIG. 1, the first sigma-delta modulator 102 receives the digital input signal 10.

Operation 304 includes generating, by the first sigma-delta modulator, a first multi-level output signal based on the digital audio signal. For example, referring to FIG. 1, the first sigma-delta modulator 102 generates the first multi-level output signal 12 based on the digital input signal 10.

Operation 306 includes generating, by a second sigma-delta modulator, a second multi-level output signal from the first multi-level output signal, where the second multi-level output signal has a number of levels less than a number of levels of the first multi-level output signal. For example, the second sigma-delta modulator 104 generates the second multi-level output signal 14 from the first multi-level output signal 12. The second multi-level output signal 14 is configured to be used to drive at least one speaker (e.g., speakers 224).

In some examples, the first multi-level output signal is generated according to a sampling frequency that is less than a sampling frequency of the second sigma-delta modulator. In some examples, the number of levels of the first multi-level output signal is two or three, and the number of levels of the first multi-level output is in a range of 4 to 300. In some examples, the first sigma-delta modulator is an N-order sigma-delta modulator (where N is greater or equal to two), and the second sigma-delta modulator has an order less than an order of the first sigma-delta modulator.

Figure 4:
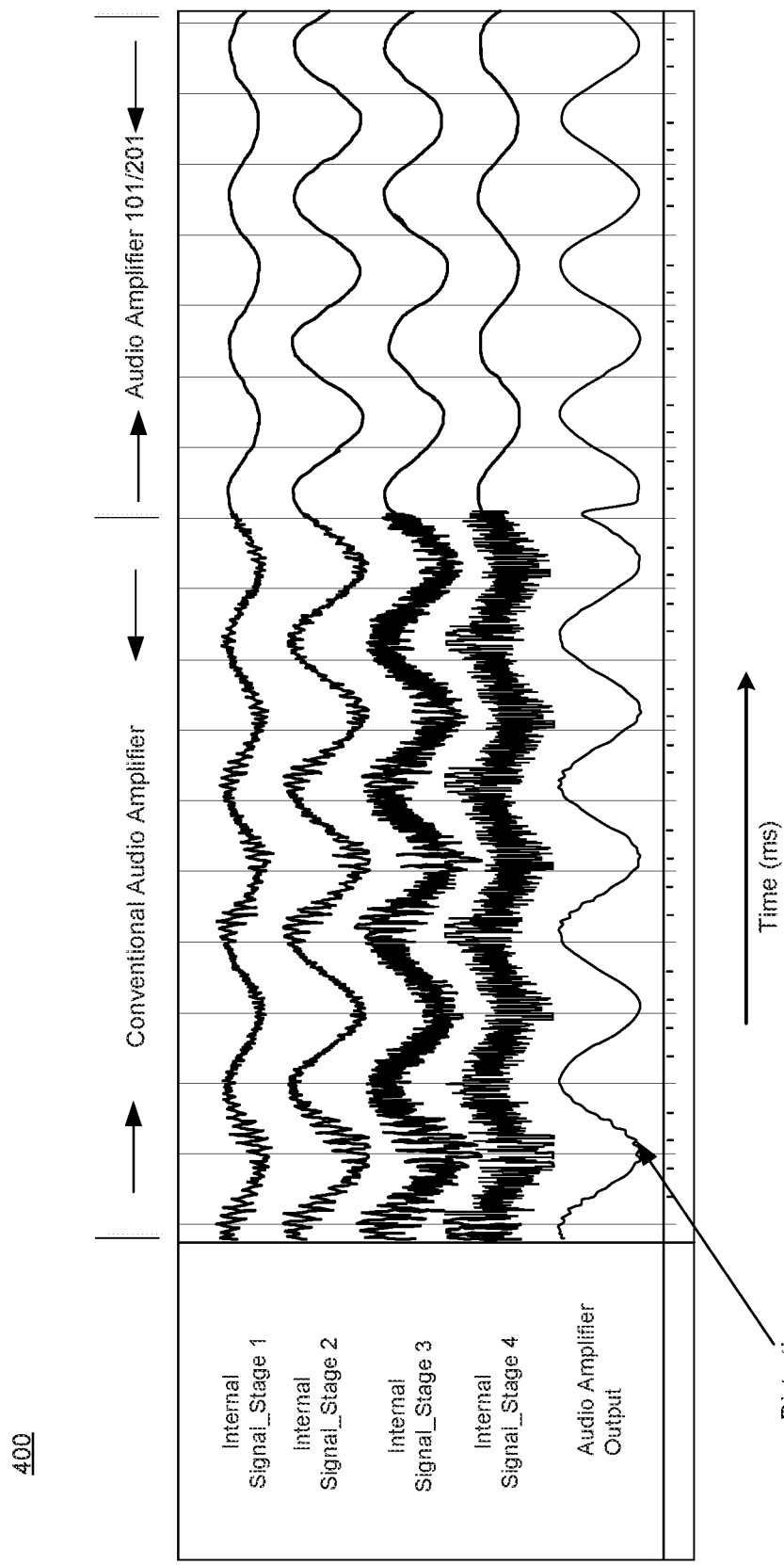
FIG. 4 illustrates a graph depicting internal signals and an output signal over time for the audio amplifiers of FIGS. 1 and 2 according to an aspect.

FIG. 4 illustrates a graph 400 depicting internal signals and an output signal over time for a conventional audio amplifier and the audio amplifier 101/201 according to an aspect. The conventional audio amplifier may include a 2-level ($4^{th}$ order) sigma-delta modulator. An audio signal is processed by the conventional audio amplifier until a predetermined point, where the processing is switched to the audio amplifier 101/201. Since the sigma-delta modulator is a $4^{th}$ order modulator, there are four internal signals (e.g., internal signal_stage 1, internal signal_stage 2, internal signal_stage 3, and internal signal_stage 4). During the signal processing by the conventional audio amplifier, the internal signals have a relatively large amount of saturation, which causes distortion on the output of the conventional audio amplifier. However, as shown in FIG. 4, during the signal processing by the audio amplifier 101/201, the saturation on the internal signals is reduced (or eliminated, which reduces or eliminates the distortion on the output of the audio amplifier 101/201.

Figure 5:
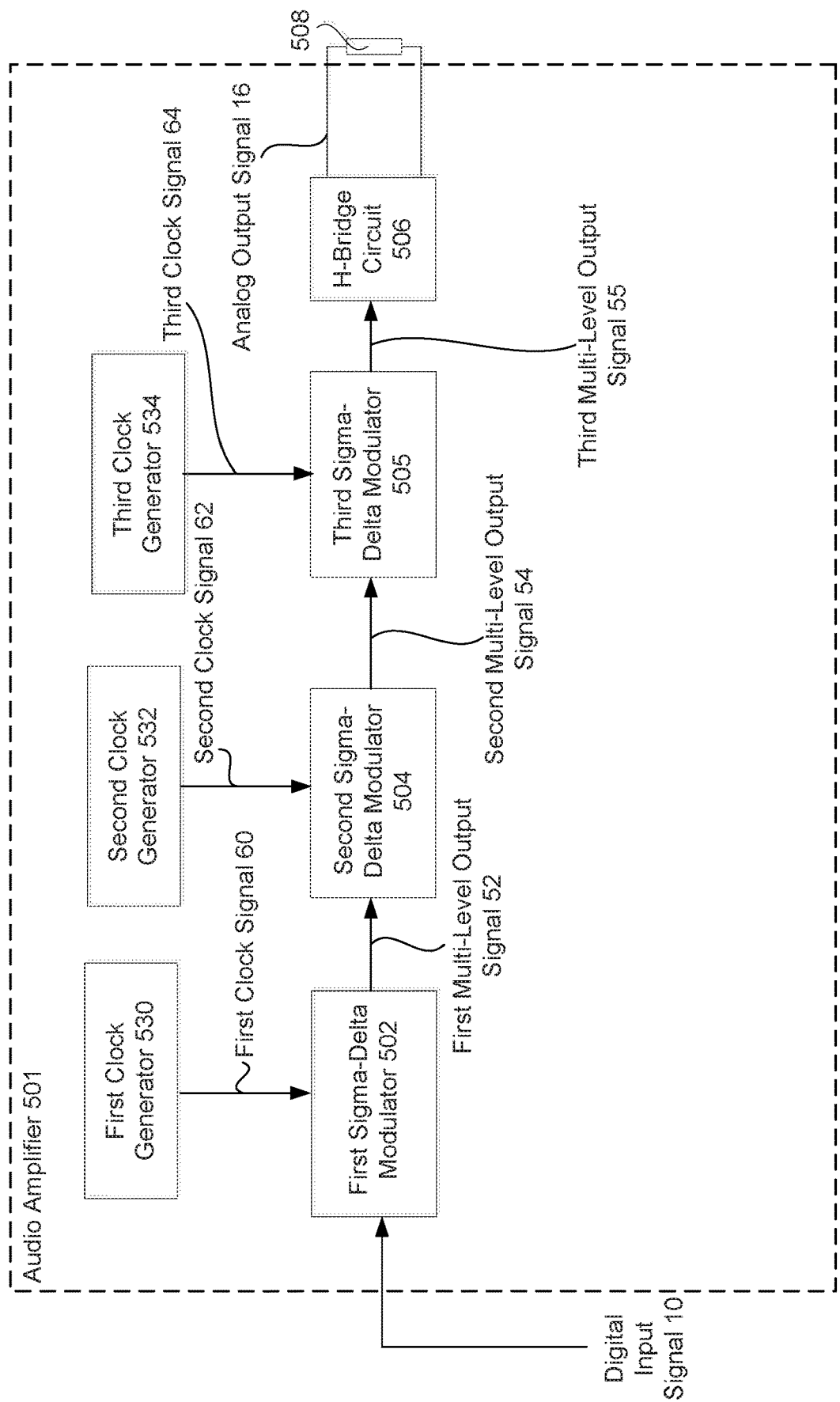
FIG. 5 illustrates an audio amplifier having multiple sigma-delta modulators to drive an output load according to an aspect.

FIG. 5 illustrates an audio amplifier 501 having three sigma-delta modulators to drive an output load according to an aspect. The audio amplifier 501 may include any of the features discussed with reference to FIGS. 1-4. The audio amplifier 501 is configured to receive a digital input signal 10 (e.g., an audio signal) and convert the digital input signal 10 to an analog output signal 16 with desirable (e.g., good) linearity (e.g., perfect linearity) with reduced saturation effects while consuming less power than conventional amplifiers. The audio amplifier 501 may include a first sigma-delta modulator 502, a second sigma-delta modulator 504, and a third sigma-delta modulator 505. The first sigma-delta modulator 502, the second sigma-delta modulator 504, and the third sigma-delta modulator 505 may include any of the features discussed with reference to the first sigma-delta modulator 102 and the second sigma-delta modulator 104 of FIG. 1.

The first sigma-delta modulator 502 is configured to receive the digital input signal 10 (e.g., the audio signal).

The second sigma-delta modulator 504 is coupled to (and configured to receive) an output of the first sigma-delta modulator 502. The third sigma-delta modulator 505 is coupled to (and configured to receive) an output of the second sigma-delta modulator 504. In some examples, the audio amplifier 501 includes an H-bridge circuit 506 configured to receive the output of the third sigma-delta modulator 505. In some examples, the H-bridge circuit 506 is considered the output stage of the audio amplifier 501. The H-bridge circuit 506 is configured to be coupled to a load 508. In some examples, the load 508 includes one or more speakers. The H-bridge circuit 506 is configured to switch the polarity of a voltage applied to the load 508. In some examples, the output of the H-bridge circuit 506 has two voltage levels (e.g., −VBAT/+VBAT). In some examples, the output of the H-bridge circuit 506 has three levels (e.g., −VBAT/0V/+VBAT).

The first sigma-delta modulator 502 is configured to generate a first multi-level output signal 52 based on the digital input signal 10, where the first multi-level output signal 52 has a plurality of first levels. The first sigma-delta modulator 502 is operated based on a first clock signal 60 that is higher than a data rate of the digital input signal 10. In some examples, the audio amplifier 501 includes a first clock generator 530 configured to generate the first clock signal 60. The first clock signal 60 may define the sampling frequency of the first sigma-delta modulator 502. In some examples, the first sigma-delta modulator 502 is an N-order sigma-delta modulator, where N is greater or equal to two.

The second sigma-delta modulator 504 is configured to generate a second multi-level output signal 54 based on the first multi-level output signal 52, where the second multi-level output signal 54 has a plurality of second levels, and the plurality of second levels is less than the plurality of first levels of the first multi-level output signal 52. The second sigma-delta modulator 504 is operated based on a second clock signal 62 that is faster than the first clock signal 60. In some examples, the audio amplifier 501 includes a second clock generator 532 configured to generate the second clock signal 62. The second clock signal 62 defines a sampling frequency of the second sigma-delta modulator 504. In some examples, the sampling frequency of the second sigma-delta modulator 504 is at least twice as fast as the sampling frequency of the first sigma-delta modulator 502. In some implementations, the second sigma-delta modulator 504 has an order less than an order of the first sigma-delta modulator 502.

The third sigma-delta modulator 505 is configured to generate a third multi-level output signal 55 based on the second multi-level output signal 54, where the third multi-level output signal 55 has a plurality of third levels, and the plurality of third levels is less than the plurality of second levels of the second multi-level output signal 54. The third sigma-delta modulator 505 is operated based on a third clock signal 64 that is faster than the second clock signal 62. In some examples, the audio amplifier 501 includes a third clock generator 534 configured to generate the third clock signal 64. The third clock signal 64 defines a sampling frequency of the third sigma-delta modulator 505. In some examples, the sampling frequency of the third sigma-delta modulator 505 is at least twice as fast as the sampling frequency of the second sigma-delta modulator 504. In some implementations, the third sigma-delta modulator 505 has an order less than an order of the second sigma-delta modulator 504.

It will be understood that, in the foregoing description, when an element is referred to as being connected to, electrically connected to, coupled to, or electrically coupled to another element, it may be directly connected or coupled to the other element, or one or more intervening elements may be present. In contrast, when an element is referred to as being directly connected to or directly coupled to another element, there are no intervening elements. Although the terms directly connected to, or directly coupled to may not be used throughout the detailed description, elements that are shown as being directly connected or directly coupled can be referred to as such. The claims of the application, if any, may be amended to recite exemplary relationships described in the specification or shown in the figures. Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application specific integrated circuit).

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. An audio amplifier comprising:
   a first clock generator configured to generate a first clock signal defining a first sampling rate;
   a second clock generator configured to generate a second clock signal defining a second sampling rate greater than the first sampling rate;
   a first sigma-delta modulator configured to receive a digital audio signal and the first clock signal, and configured to generate a first multi-level output signal according to the first clock signal; and
   a second sigma-delta modulator configured to receive the first multi-level output signal from the first sigma-delta modulator and the second clock signal, and configured to generate a second multi-level output signal according to the second clock signal, the second multi-level output signal having a number of levels less than a number of levels of the first multi-level output signal, the number of levels of the second multi-level output signal being two or three.

2. The audio amplifier of claim 1, wherein the number of levels of the first multi-level output is at least three times more than the number of levels of the second multi-level output.

3. The audio amplifier of claim 1, wherein the number of levels of the first multi-level output is greater than four.

4. The audio amplifier of claim 1, wherein the second sampling rate is at least four times greater than the first sampling rate.

5. The audio amplifier of claim 1, further comprising:
a third sigma-delta modulator coupled between the first sigma-delta modulator and the second sigma-delta modulator.

6. The audio amplifier of claim 1, further comprising:
an H-bridge circuit configured to be driven by the second multi-level output signal, wherein the H-bridge circuit is configured to drive an impedance load of less than fifty ohms.

7. The audio amplifier of claim 6, wherein the H-bridge circuit is configured to be coupled to one or more speakers having an impedance load of less than ten ohms.

8. The audio amplifier of claim 1, wherein the first sigma-delta modulator is an N-order sigma-delta modulator, and N is greater or equal to two.

9. The audio amplifier of claim 8, wherein the second sigma-delta modulator is a first order sigma-delta modulator.

10. The audio amplifier of claim 1, wherein the audio amplifier is a class-D amplifier.

11. A device comprising:
an audio amplifier configured to be coupled to one or more speakers and a battery, the audio amplifier including:
a first sigma-delta modulator configured to receive a digital audio signal and generate a first multi-level output signal based on the audio signal according to a first sampling rate, the first sigma-delta modulator having an order greater or equal to two;
a second sigma-delta modulator configured to receive the first multi-level output signal from the first sigma-delta modulator and generate a second multi-level output signal according to a second sampling rate, the second sampling rate being greater than the first sampling rate, the second multi-level output signal having a number of levels less than a number of levels of the first multi-level output signal, the second sigma-delta modulator being a first order sigma-delta modulator, the number of levels of the second multi-level output signal being two or three; and
an H-bridge circuit configured to be driven by the second multi-level output signal and generate an analog output signal to the one or more speakers,
wherein a time in which the audio amplifier applies a voltage of the battery to the one or more speakers is less than one percent of a total battery time.

12. The device of claim 11, wherein the one or more speakers are coupled to the H-bridge circuit, the one or more speakers having an impedance equal to or less than ten ohms.

13. The device of claim 11, further comprising:
an application specific integrated circuit (ASIC), the ASIC including the audio amplifier.

14. The device of claim 13, wherein the ASIC further includes one or more voltage regulators, one or more clock generators, and one or more analog to digital converters.

15. A method for modulating an audio signal to drive one or more speakers, the method comprising:
receiving, by a first sigma-delta modulator of an audio amplifier, a digital audio signal;
generating, by the first sigma-delta modulator, a first multi-level output signal based on the digital audio signal; and
generating, by a second sigma-delta modulator of the audio amplifier, a second multi-level output signal from the first multi-level output signal, the second multi-level output signal having a number of levels less than a number of levels of the first multi-level output signal, the number of levels of the second multi-level output signal being two or three; and
switching a polarity of a voltage applied to one or more speakers according to the second multi-level output signal.

16. The method of claim 15, further comprising:
generating, by a first clock generator, a first clock signal defining a first sampling rate;
generating, by a second clock generator, a second clock signal defining a second sampling rate;
receiving, by the first sigma-delta modulator, the first clock signal from the first clock generator; and
receiving, by the second sigma-delta modulator, the second clock signal from the second clock generator.

17. The method of claim 15, further comprising:
applying, by the audio amplifier, a voltage of a battery to the one or more speakers during a period of time that is less one percent of a total battery time.

18. The method of claim 16, wherein the first sigma-delta modulator is an N-order sigma-delta modulator, and N is greater or equal to two, wherein the second sigma-delta modulator is a first order sigma-delta modulator, wherein the second sampling rate is greater than the first sampling rate, wherein the one or more speakers has an impedance less than fifty ohms.

* * * * *